(12) United States Patent
Wright et al.

(10) Patent No.: US 10,522,072 B2
(45) Date of Patent: Dec. 31, 2019

(54) DISPLAY WITH VIAS FOR CONCEALED PRINTED CIRCUIT AND COMPONENT ATTACHMENT

(71) Applicant: Apple Inc., Cupertino, CA (US)

(72) Inventors: Derek Wright, San Francisco, CA (US); Fletcher R. Rothkopf, Los Altos, CA (US); Scott A. Myers, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 120 days.

(21) Appl. No.: 15/796,675

(22) Filed: Oct. 27, 2017

(65) Prior Publication Data

US 2018/0047334 A1 Feb. 15, 2018

Related U.S. Application Data

(63) Continuation of application No. 14/866,494, filed on Sep. 25, 2015, now Pat. No. 9,805,643, which is a continuation of application No. 13/284,096, filed on Oct. 28, 2011, now Pat. No. 9,286,826.

(51) Int. Cl.
*G09G 3/3208* (2016.01)
*H01L 51/52* (2006.01)
*H01L 27/32* (2006.01)
*H05K 1/11* (2006.01)

(52) U.S. Cl.
CPC ....... *G09G 3/3208* (2013.01); *H01L 27/3276* (2013.01); *H01L 51/52* (2013.01); *H05K 1/115* (2013.01); *G09G 2300/0426* (2013.01)

(58) Field of Classification Search
None
See application file for complete search history.

(56) References Cited

U.S. PATENT DOCUMENTS

| | | |
|---|---|---|
| 2,933,655 A | 4/1960 | Gradisar et al. |
| 4,066,855 A | 1/1978 | Zenk |
| 4,085,302 A | 4/1978 | Zenk et al. |
| 4,431,270 A | 2/1984 | Funada |
| 4,487,993 A | 12/1984 | Becker |
| 4,549,174 A | 10/1985 | Funada |

(Continued)

FOREIGN PATENT DOCUMENTS

| | | |
|---|---|---|
| CN | 1912716 | 2/2007 |
| CN | 101430473 | 5/2009 |

(Continued)

OTHER PUBLICATIONS

Drzaic et al., U.S. Appl. No. 13/253,844, filed Oct. 5, 2011.
Zhong et al., U.S. Appl. No. 13/600,862, filed Aug. 31, 2012.

*Primary Examiner* — Nicholas J Lee
(74) *Attorney, Agent, or Firm* — Treyz Law Group, P.C.; G. Victor Treyz; David K. Cole

(57) ABSTRACT

An electronic device may include a display. The display may be an organic light-emitting diode display. The organic light-emitting diode display may have a substrate layer, a layer of organic light-emitting diode structures, and a layer of sealant. Vias may be formed in the substrate layer by laser drilling. The vias may be filled with metal using electroplating or other metal deposition techniques. The vias may be connected to contacts on the rear surface of the display. Components such as flexible printed circuits, integrated circuits, connectors, and other circuitry may be mounted to the contacts on the rear surface of the display.

20 Claims, 6 Drawing Sheets

(56) References Cited

U.S. PATENT DOCUMENTS

| | | |
|---|---|---|
| 5,235,451 A | 8/1993 | Bryan |
| 5,276,382 A | 1/1994 | Stocker et al. |
| 5,436,744 A | 7/1995 | Arledge et al. |
| 5,483,261 A | 1/1996 | Yasutake |
| 5,488,204 A | 1/1996 | Mead et al. |
| 5,493,069 A | 2/1996 | Koh |
| 5,577,205 A | 11/1996 | Hwang et al. |
| 5,592,199 A | 1/1997 | Kawaguchi |
| 5,670,994 A | 9/1997 | Kawaguchi |
| 5,825,352 A | 10/1998 | Bisset et al. |
| 5,835,079 A | 11/1998 | Shieh |
| 5,844,781 A | 12/1998 | Schlotter et al. |
| 5,880,411 A | 3/1999 | Gillespie et al. |
| 5,880,705 A | 3/1999 | Onyskevych et al. |
| 6,091,194 A | 7/2000 | Swirbel et al. |
| 6,188,391 B1 | 2/2001 | Seely et al. |
| 6,191,435 B1 | 2/2001 | Inoue |
| 6,201,346 B1 | 3/2001 | Kusaka |
| 6,239,982 B1 | 5/2001 | Bozzer et al. |
| 6,310,610 B1 | 10/2001 | Beaton et al. |
| 6,323,846 B1 | 11/2001 | Westerman et al. |
| 6,421,033 B1 | 7/2002 | Williams et al. |
| 6,498,592 B1 | 12/2002 | Matthies |
| 6,560,117 B2 | 5/2003 | Moon |
| 6,617,177 B1 | 9/2003 | Winer |
| 6,690,387 B2 | 2/2004 | Zimmerman et al. |
| 6,738,263 B2 | 5/2004 | Corisis et al. |
| 6,774,872 B1 | 8/2004 | Kawada et al. |
| 6,801,174 B2 | 10/2004 | Kayama et al. |
| 6,815,835 B2 | 11/2004 | James |
| 7,015,894 B2 | 3/2006 | Morohoshi |
| 7,133,037 B2 | 11/2006 | Kim et al. |
| 7,184,064 B2 | 2/2007 | Zimmerman et al. |
| 7,211,738 B2 | 5/2007 | Lee et al. |
| 7,245,500 B2 | 7/2007 | Khan et al. |
| 7,342,354 B2 | 3/2008 | Utsunomiya et al. |
| 7,417,867 B1 | 8/2008 | Matsuda et al. |
| 7,663,607 B2 | 2/2010 | Hotelling et al. |
| 7,791,700 B2 | 9/2010 | Bellamy |
| 7,796,397 B2 | 9/2010 | Yamauchi et al. |
| 7,816,721 B2 | 10/2010 | Yamazaki et al. |
| 7,864,136 B2 | 1/2011 | Matthies et al. |
| 7,977,170 B2 | 7/2011 | Tredwell et al. |
| 8,148,259 B2 | 4/2012 | Arai et al. |
| 8,169,588 B2 | 5/2012 | Oikawa et al. |
| 8,194,222 B2 | 6/2012 | Seki et al. |
| 8,222,666 B2 | 7/2012 | Hatano et al. |
| 8,253,914 B2 | 8/2012 | Kajiya et al. |
| 8,258,523 B2 | 9/2012 | Lee et al. |
| 8,269,923 B2 | 9/2012 | Yamagishi et al. |
| 8,362,488 B2 | 1/2013 | Chaug et al. |
| 8,395,722 B2 | 3/2013 | Mathew et al. |
| 8,446,557 B2 | 5/2013 | Oohira |
| 8,450,769 B2 | 5/2013 | Hatano et al. |
| 8,456,586 B2 | 6/2013 | Mathew et al. |
| 8,466,852 B2 | 6/2013 | Drzaic et al. |
| 8,599,353 B2 | 12/2013 | Corrigan et al. |
| 8,623,575 B2 | 1/2014 | Chen et al. |
| 8,674,344 B2 | 3/2014 | Lee et al. |
| 8,736,802 B2 | 5/2014 | Kajiya et al. |
| 8,766,314 B2 | 7/2014 | Hatano et al. |
| 8,766,858 B2 | 7/2014 | Li et al. |
| 8,767,141 B2 | 7/2014 | Mathew et al. |
| 8,804,347 B2 | 8/2014 | Martisauskas |
| 8,829,790 B2 | 9/2014 | Yee |
| 9,195,105 B2 | 11/2015 | Kajiya et al. |
| 2001/0015788 A1 | 8/2001 | Mandai et al. |
| 2002/0085158 A1 | 7/2002 | Armagost et al. |
| 2002/0088986 A1 | 7/2002 | Kayama et al. |
| 2003/0011298 A1 | 1/2003 | Palanisamy |
| 2003/0206331 A1 | 11/2003 | Chung et al. |
| 2004/0016568 A1 | 1/2004 | Palanisamy |
| 2004/0245924 A1 | 12/2004 | Ustunomiya et al. |
| 2004/0263947 A1 | 12/2004 | Drzaic et al. |
| 2005/0072597 A1 | 4/2005 | Lee et al. |
| 2006/0026521 A1 | 2/2006 | Hotelling et al. |
| 2006/0026536 A1 | 2/2006 | Hotelling et al. |
| 2006/0125995 A1 | 6/2006 | Tai et al. |
| 2006/0152500 A1 | 7/2006 | Weng |
| 2006/0197753 A1 | 9/2006 | Hotelling et al. |
| 2006/0231844 A1 | 10/2006 | Carter |
| 2007/0002009 A1 | 1/2007 | Pasch et al. |
| 2007/0019147 A1 | 1/2007 | Ryu |
| 2007/0035679 A1 | 2/2007 | Lee et al. |
| 2007/0063939 A1 | 3/2007 | Bellamy |
| 2007/0080360 A1 | 4/2007 | Mirsky et al. |
| 2007/0148831 A1 | 6/2007 | Nagata et al. |
| 2008/0024060 A1 | 1/2008 | Jonnalagadda et al. |
| 2008/0035929 A1 | 2/2008 | Chen et al. |
| 2008/0042180 A1 | 2/2008 | Yamazaki et al. |
| 2008/0049408 A1 | 2/2008 | Yamauchi et al. |
| 2008/0143913 A1 | 6/2008 | Lee et al. |
| 2008/0149731 A1 | 6/2008 | Arai et al. |
| 2009/0027896 A1 | 1/2009 | Nishimura et al. |
| 2009/0122653 A1 | 5/2009 | Seki |
| 2009/0191670 A1 | 7/2009 | Heitzinger et al. |
| 2009/0278452 A1 | 11/2009 | Kim |
| 2009/0284688 A1 | 11/2009 | Shiraishi et al. |
| 2010/0097551 A1 | 4/2010 | Yamagishi et al. |
| 2010/0148209 A1 | 6/2010 | Hatano et al. |
| 2010/0265225 A1 | 10/2010 | Han et al. |
| 2010/0315570 A1 | 12/2010 | Mathew et al. |
| 2011/0012845 A1 | 1/2011 | Rothkopf et al. |
| 2011/0109829 A1 | 5/2011 | Mathew et al. |
| 2011/0176199 A1 | 7/2011 | Sakurai et al. |
| 2011/0186345 A1 | 8/2011 | Pakula et al. |
| 2011/0194063 A1 | 8/2011 | Lee et al. |
| 2011/0204403 A1 | 8/2011 | Kim et al. |
| 2011/0292323 A1 | 12/2011 | Corrigan et al. |
| 2011/0317120 A1 | 12/2011 | Kijiya et al. |
| 2012/0009973 A1 | 1/2012 | Demuynck et al. |
| 2012/0218502 A1 | 8/2012 | Seki |
| 2012/0235969 A1 | 9/2012 | Burns et al. |
| 2012/0242592 A1 | 9/2012 | Rothkopf et al. |
| 2012/0273834 A1 | 11/2012 | Hatano et al. |
| 2012/0287386 A1 | 11/2012 | Kijiya et al. |
| 2012/0319304 A1 | 12/2012 | Pressel et al. |
| 2012/0320319 A1 | 12/2012 | Chen et al. |
| 2013/0002685 A1 | 1/2013 | Shenoy et al. |
| 2013/0082984 A1 | 4/2013 | Drzaic et al. |
| 2013/0088671 A1 | 4/2013 | Drzaic et al. |
| 2013/0094126 A1 | 4/2013 | Rappoport et al. |
| 2013/0107476 A1 | 5/2013 | Wright et al. |
| 2013/0228785 A1 | 9/2013 | Hatano et al. |
| 2013/0328051 A1 | 12/2013 | Franklin et al. |
| 2013/0342099 A1 | 12/2013 | Weber et al. |
| 2014/0049522 A1 | 2/2014 | Mathew et al. |
| 2014/0063393 A1 | 3/2014 | Zhong et al. |
| 2014/0138733 A1 | 5/2014 | Hatano et al. |
| 2014/0254094 A1 | 9/2014 | Chang et al. |
| 2014/0293210 A1 | 10/2014 | Kijiya et al. |

FOREIGN PATENT DOCUMENTS

| | | |
|---|---|---|
| CN | 101636689 | 1/2010 |
| CN | 102187272 | 9/2011 |
| EP | 0474508 | 3/1992 |
| EP | 2138892 | 3/2002 |
| EP | 2141573 | 6/2010 |
| EP | 2418537 | 2/2012 |
| JP | 10-261854 | 9/1998 |
| JP | 200163031 | 6/2000 |
| JP | 2001-092381 | 4/2001 |
| JP | 2001215528 | 8/2001 |
| JP | 2002-040472 | 2/2002 |
| JP | 200293851 | 3/2002 |
| JP | 2002116454 | 4/2002 |
| JP | 2002-341785 A | 11/2002 |
| JP | 2002342033 | 11/2002 |
| JP | H05-142556 A | 11/2002 |
| JP | 2003058074 | 2/2003 |
| JP | 2003-255850 | 9/2003 |
| JP | 2003-337353 | 11/2003 |
| JP | 3593975 | 11/2004 |

(56) References Cited

FOREIGN PATENT DOCUMENTS

| | | |
|---|---|---|
| JP | 200549685 | 2/2005 |
| JP | 2007220569 | 8/2007 |
| JP | 2008-033094 | 2/2008 |
| JP | 2009-098451 A | 5/2009 |
| JP | 2009-229754 A | 10/2009 |
| JP | 2009-244338 | 10/2009 |
| JP | 2010-039211 A | 2/2010 |
| JP | 2011042531 | 3/2011 |
| KR | 10-2005-0093595 | 9/2005 |
| KR | 10-2010-005021 | 1/2010 |
| KR | 10-2011-0059629 | 6/2011 |
| KR | 10-2012-0020088 | 3/2012 |
| TW | 200521587 A | 7/2005 |
| TW | 297095 B | 5/2008 |
| TW | 200839356 | 10/2008 |
| TW | 201001624 A | 1/2010 |
| WO | 2006106365 | 10/2006 |
| WO | 2008/114404 A | 9/2008 |
| WO | 2009089105 | 7/2009 |

DISPLAY WITH VIAS FOR CONCEALED PRINTED CIRCUIT AND COMPONENT ATTACHMENT

This application is a continuation of U.S. patent application Ser. No. 14/866,494, filed Sep. 25, 2015, which is a continuation of U.S. patent application Ser. No. 13/284,096, filed on Oct. 28, 2011, each of which are hereby incorporated by reference herein in their entireties. This application claims the benefit of and claims priority to U.S. patent application Ser. No. 14/866,494, filed Sep. 25, 2015, and U.S. patent application Ser. No. 13/284,096, filed on Oct. 28, 2011.

BACKGROUND

This relates generally to electronic devices, and more particularly, to displays for use in electronic devices.

Electronic devices such as portable computers and other electronic equipment may have displays. Driver circuitry may be used to control operation of the displays. In some displays, such as liquid crystal displays, a layer such as a thin-film transistor layer may have a ledge portion on which a display driver integrated circuit is mounted. The minimum size needed for the ledge is at least partly dictated by the size of the driver integrated circuit. In some device designs, such as designs for compact portable devices, the inclusion of this type of driver ledge may give rise to a border region for a liquid crystal display that is larger than desired. In other displays, driver circuitry may be coupled to the display using a flexible printed circuit cable. The attachment structures needed to accommodate attachment of the flexible printed circuit cable to the display may consume more area than desired, particularly in compact devices and in arrangements where thin display borders are desired.

It would therefore be desirable to provide improved ways to interconnect displays with associated circuitry such as display driver circuitry.

SUMMARY

An electronic device may include a display. The display may be an organic light-emitting diode display. The organic light-emitting diode display may, for example, have a substrate layer, a layer of organic light-emitting diode structures, and a layer of sealant.

Vias may be formed in a display substrate layer by laser drilling or other via hole formation techniques. The vias may be filled with a conductive material such as metal using electroplating or other metal deposition techniques. The vias may be connected to contacts on the rear surface of the display. Components such as flexible printed circuits, integrated circuits, connectors, and other circuitry may be mounted to the contacts on the rear surface of the display. Conductive materials such as solder and conductive adhesive may be used in mounting components to the contacts.

Further features of the invention, its nature and various advantages will be more apparent from the accompanying drawings and the following detailed description.

DETAILED DESCRIPTION

Figure 1:
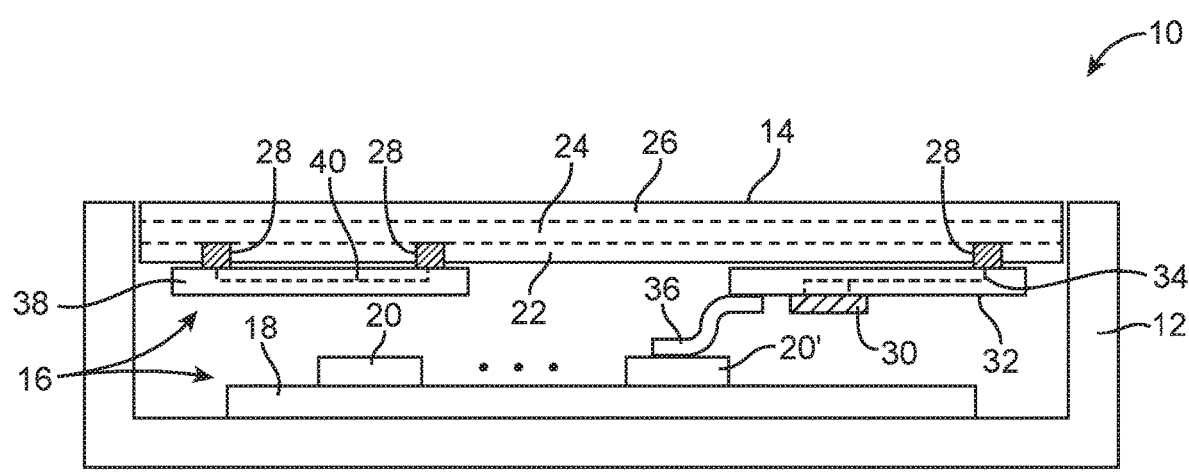
FIGS. 1 and 2 are cross-sectional side views of illustrative electronic devices with displays in accordance with embodiments of the present invention.

Electronic devices may be provided with displays having vias. An illustrative electronic device of the type that may be provided with a display having vias is shown in FIG. 1. Electronic device 10 of FIG. 1 may be a computer, a personal computer, a tablet computer, a cellular telephone, a media player, a gaming device, a navigation device, or other electronic equipment. As shown in the cross-sectional view of device 10 in FIG. 1, electronic device 10 may include housing 12, a display such as display 14, and internal components such as components 16.

Housing 12 may be formed from plastic, metal, fiber-composite materials, glass, ceramic, other materials, or combinations of these materials. Display 14 may be a liquid crystal display, an organic light-emitting diode display, a plasma display, an electrochromic display, an electrophoretic ink display, an electrowetting display, or other suitable display. Examples in which display 14 is implemented as an organic light-emitting diode display are sometimes described herein as an example. This is, however, merely illustrative. Display 14 may be formed using any suitable display if desired. If desired, display 14 may be covered with a cover layer of glass or plastic or other protective display layer. In the example of FIG. 1, the cover layer has been omitted.

Internal components 16 may include printed circuits such as rigid printed circuit boards (e.g., fiberglass-filled epoxy printed circuit boards), flexible printed circuits ("flex circuits") formed from flexible sheets of polymers such as polyimide, "rigid flex" printed circuits (e.g., printed circuit boards including rigid printed circuit portions with integral flex circuit tails), or other printed circuit structures. As an example, device 10 may include a printed circuit such as printed circuit board 18 on which one or more components such as electrical components 20 or other internal components 16 have been mounted. Components 20 may include switches, connectors, discrete components such as capacitors, resistors, and inductors, integrated circuits, and other electronic components.

As shown in FIG. 1, display 14 may have multiple layers. For example, display 14 may be an organic light-emitting diode display having a substrate layer such as substrate layer 22, a layer of thin-film transistor structures (e.g., polysilicon transistors and/or amorphous silicon transistors) and organic emissive material such as layer 24, and a sealant layer such as layer 26. Substrate layer 22 may be formed from a rigid or flexible dielectric such as glass, ceramic, or plastic. As an example, substrate 22 in display 14 may be formed from a flexible sheet of polymer such as a layer of polyimide.

Vias such as vias 28 may be formed in display 14. As shown in FIG. 1, for example, vias 28 may be formed through substrate layer 22 so that electrical contacts may be formed on the rear (inner) surface of substrate 22 and display 14. Vias 28 may be formed by laser drilling and electroplating or using other fabrication techniques. Conductive material in vias 28 such as metal (e.g., gold plated copper) may be used to form signal paths in display 14. The signal paths may, for example, be used to route signals between the circuitry of layer 24 (e.g., thin-film transistors) and external circuitry such as display driver circuitry.

In the example of FIG. 1, display driver circuitry for display 14 has been provided using display driver integrated circuit 30. Display driver integrated circuit 30 (in the FIG. 1 example) has been mounted on printed circuit 32. Printed circuit 32 may be a rigid printed circuit board or a flex circuit. For example, printed circuit 32 may be a flex circuit that includes one or more layers of patterned interconnect lines such as traces 34. Traces 34 may be electrically connected between one or more vias in substrate layer 22 of display 14 and driver integrated circuit 30. If desired, traces 34 may be connected to a communications path formed from flex circuit 36 (e.g., a flex circuit that is connected to printed circuit board 18 directly or, as shown in FIG. 1, a flex circuit that is connected to components 20 on printed circuit board 18 via flex circuit connector 20'). The connection between flex circuit 36 and printed circuit 32 may be formed using a connector or by directly attaching flex circuit 36 to traces 34 on printed circuit 32.

By using vias 28 in layer 22, the need to form flex circuit attachments or driver circuit attachments to the front (upper/exterior) surface of display 14 may be avoided, allowing the edge regions surrounding the active display pixels in display 14 to be minimized. More area in display 14 may therefore be available for forming the array of pixels that displays images to a user.

If desired, a jumper structure such as structure 38 may be attached to vias on the backside of substrate 22 and may be used to route signals between two or more different locations in display 14. Structure 38 may be formed from a printed circuit such as a flex circuit or rigid printed circuit board. Traces 40 in structures 38 may be used to help distribute signals for display 14. Any suitable signals may be routed through flex circuits or other jumper structures on the rear of display 14. For example, structures 38 may be used to carry gate line signals, data line signals, power supply signals, or other information or power signals associated with operating display 14. By implementing at least some of the interconnect resources associated with display 14 using structures located on the rear surface of display 14, more room may be made available on the front surface of display 14 for active pixel structures and the size of any inactive border regions on the front side of display 14 may be minimized.

In the illustrative arrangement of FIG. 1, flex circuit 32 is being used to support display driver integrated circuit 30 and a separate flex circuit such as flex circuit 36 is being used to couple flex circuit 32 to printed circuit board 18 (using connector 20'). Other arrangements may be used if desired. For example, flex circuit 32 may be connected directly to traces on printed circuit board 18 (e.g., using anisotropic conductive film or solder connections) or flex circuit 32 may be connected directly to connector 20'. There may be more than one flex circuit such as flex circuit 32 that is interconnected between rear surface vias 28 on display 14 and circuitry such as circuitry in components 20 on printed circuit board 18. Supplemental interconnection pathways such as traces 40 of flex circuit 38 may be provided on one or more, two or more, or three or more integrated circuits. Flex circuits such as flex circuit 32 may include mounted circuits such as display driver integrated circuit 30 for controlling the operation of display 14 and may, if desired, include supplemental interconnect lines for forming gate line paths, data line paths, power lines paths, or other signal paths in device 10. Supplemental interconnect lines for forming gate line paths, data line paths, power lines paths, or other signal paths in device 10 may also be formed using jumper structures 38.

Figure 2:
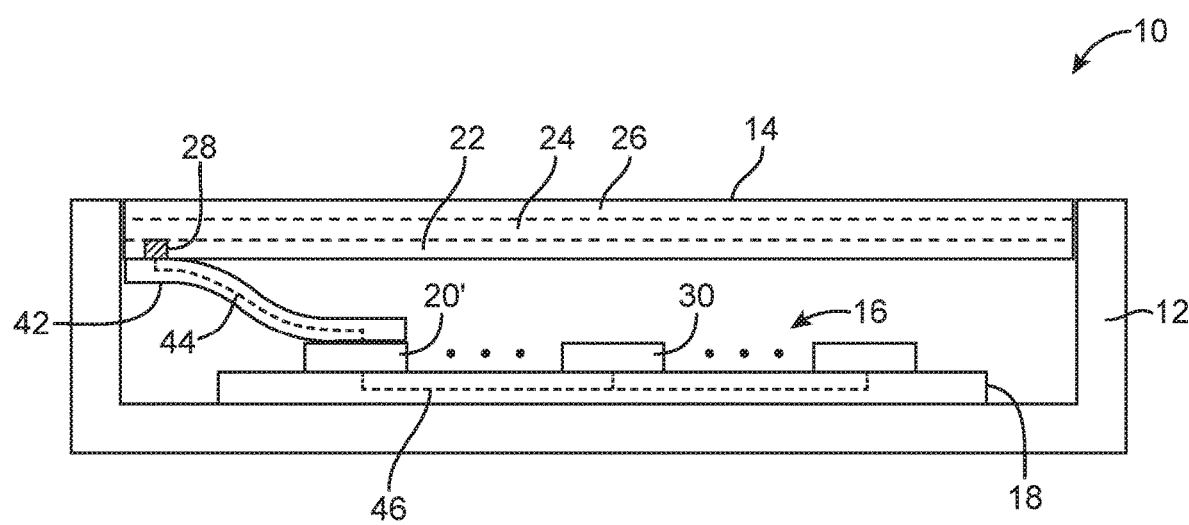

As shown in FIG. 2, a printed circuit such as flex circuit 42 may have traces such as traces 44 that form a path between vias 28 in substrate 22 of display 14 and circuitry on printed circuit board 18. A connector such as connector 20' of FIG. 2 or a direct attachment scheme (e.g., using solder or anisotropic conductive film) may be used to interconnect traces 44 to traces on printed circuit board 18 such as traces 46. Display driver circuitry 30 (e.g., a display driver integrated circuit) may, if desired, be mounted on printed circuit 18 and may be coupled to traces 44 in printed circuit 42 via traces 46.

Figure 3:
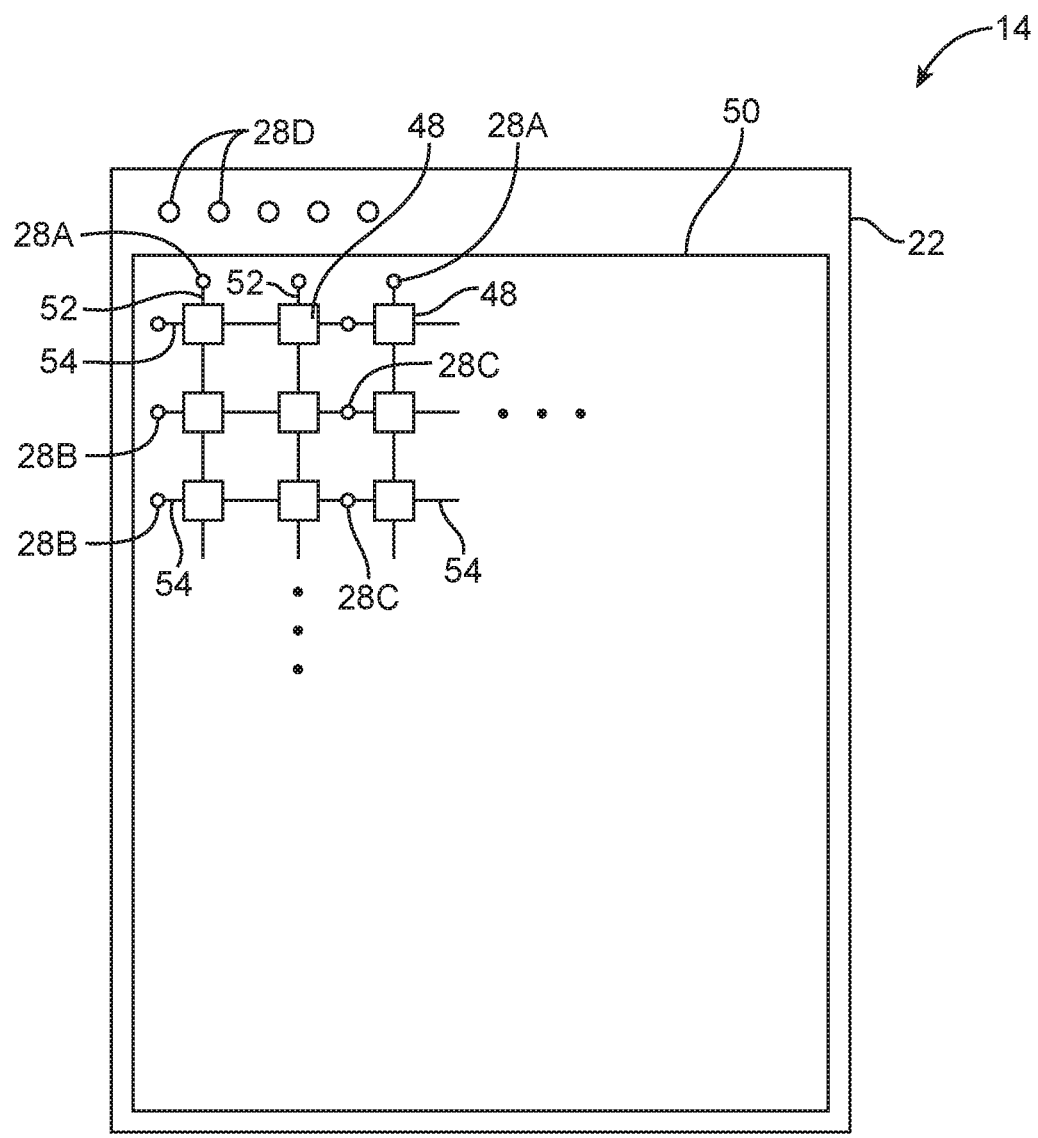
FIG. 3 is a top view of an illustrative display showing how vias may be used in distributing signals for the display in accordance with an embodiment of the present invention.

An arrangement that may be used for providing vias 28 in display 14 is shown the top view of illustrative display 14 of FIG. 3. As shown in FIG. 3, display 14 may display pixels such as display pixels 48. Display pixels 48 may each contain an organic light-emitting diode structure for emitting light for display 14. Display pixels 48 may be organized in an array such as array 50. Array 50 may contain any suitable number or rows and columns of display pixels 48. For example, array 50 may have hundreds of rows and/or hundreds of columns of display pixels 48 (as an example). Vertical and horizontal control lines may be used in supplying control signals to display pixels 48. For example, signals may be applied to respective columns of display pixels 48 using vertical signal lines such as lines 52 and may be applied to respective rows of display pixels 48 using horizontal signal lines such as lines 54.

If desired, signal lines such as lines 52 may be coupled to vias in substrate layer 22 of display 14 such as vias 28A. Signal lines such as lines 54 may be coupled to vias in substrate layer 22 of display 14 such as vias 28B. Vias in substrate layer 22 such as vias 28C may be formed within array 50 (e.g., at intermediate locations in the rows or columns of display pixels 48). Edge vias such as vias 28D may also be formed in substrate 22 and may be used for handling signals associated with operating display pixels 48 (e.g., signals for lines 52 and/or 54).

Figure 4:
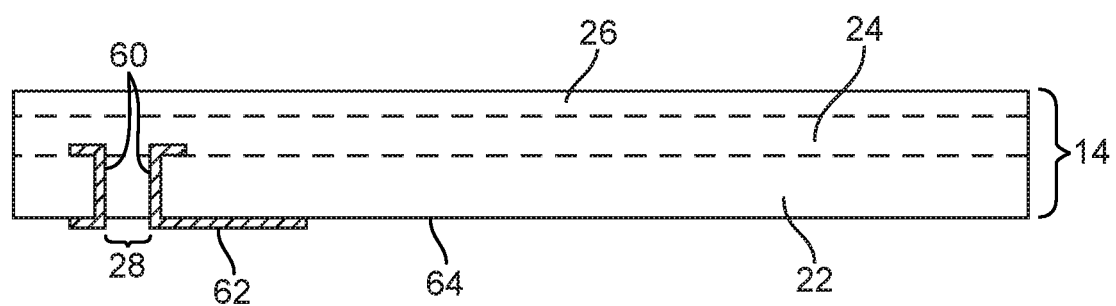
FIG. 4 is a cross-sectional side view of a portion of a display showing how a via may be formed through the rear surface of the display in accordance with an embodiment of the present invention.

A cross-sectional side view of a portion of display 14 containing a via is shown in FIG. 4. Via 28 may be one of vias 28 of FIGS. 1 and 2, one of vias 28A, 28B, 28C, or 28D of FIG. 3, or other vias formed through substrate 22 of display 14. As shown in FIG. 4, via 28 may include tubular metal sidewalls such as sidewalls 60 that coat the cylindrical inner surface of a through hole in layer 22. Sidewalls 60 may be formed by any suitable fabrication technique. For example, sidewalls 60 may be formed using electrodeposition (e.g., formation of a thin seed layer followed by electroplating of a metal such as copper and, if desired, a subsequent coating of a metal such as gold). With a via structure of the type shown in FIG. 4, via 28 is formed from a hole (e.g., a cylindrical hole) in substrate 22 and is lined with a tubular layer of metal. Other types of vias may be formed in layer 22 if desired (e.g., via holes that are plugged with solid metal, etc.).

If desired, traces may be formed on the surface of substrate 22. As shown in FIG. 4, for example, contact pad 62 may be formed on rear surface 64 of display 14. Contact 62 may be formed from a metal trace that is electrically shorted to sidewalls 60 of via 28. Additional patterned conductive structures may be formed on surface 64 of substrate 22 if desired. The example of FIG. 4 is merely illustrative.

Figure 5:
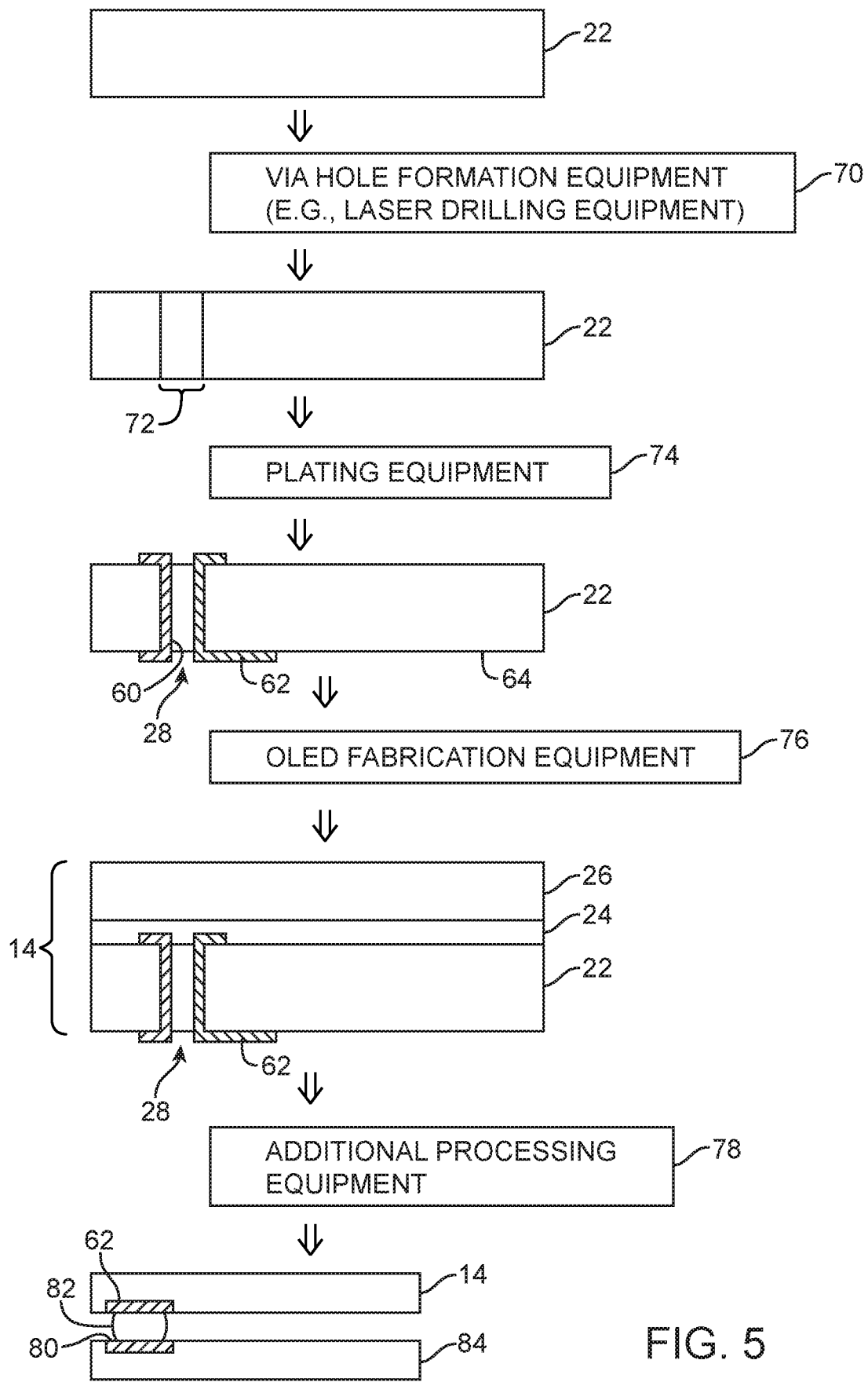
FIG. 5 is a diagram showing how a display may be provided with vias so that circuitry can be attached to the rear of the display in accordance with an embodiment of the present invention.

FIG. 5 is a diagram showing how a display may be provided with vias. Initially, a display substrate such as substrate 22 may be provided. Substrate 22 may be, for example, a layer of polymer such as a layer of polyimide.

Via hole formation equipment 70 such as laser drilling equipment may be used to form one or more via holes such as via hole 72 in substrate 22.

Following formation of via holes such as via hole 72, conductive material deposition equipment such as metal plating equipment 74 may be used to form conductive structures for vias 28 such as conductive sidewalls 60. Traces such as contact trace 62 may also be formed on lower surface 64 of substrate 22.

Organic light-emitting diode (OLED) fabrication equipment 76 or other display fabrication equipment may be used to complete display 14. For example, OLED fabrication equipment 76 may be used to form thin-film transistor structures and interconnects in layer 24. Layer 24 may include organic emissive material and light-emitting diode structures that are used to form display pixels such as display pixels 48 of FIG. 3. A sealant layer such as sealant layer 26 (e.g., a polymer layer) may then be formed over the front (upper) surface of display 14 to protect the structures of layer 24.

Additional processing equipment 78 may then be used to form electrical connections to additional circuitry 84. As shown in FIG. 5, conductive material 82 may be used in forming electrical connections between contacts such as contact 62 on display 14 (e.g., contacts on surface 64 of substrate 22) and associated contacts such as contact 80 on additional circuitry 84. Conductive material 82 may be solder, metal associated with a weld, part of a connector, conductive adhesive (e.g., anisotropic conductive film), or other suitable material for forming an electrical connection between via 28 and additional circuitry 84. Additional circuitry 84 may be a printed circuit or other circuitry. For example, additional circuitry 84 may be a flex circuit on which integrated circuits and/or other electrical components are mounted, a flex circuit cable that is attached to a printed circuit board with components, a rigid printed circuit board, or other suitable circuitry (see, e.g., the illustrative arrangements of FIGS. 1, 2, and 3).

Figure 6:
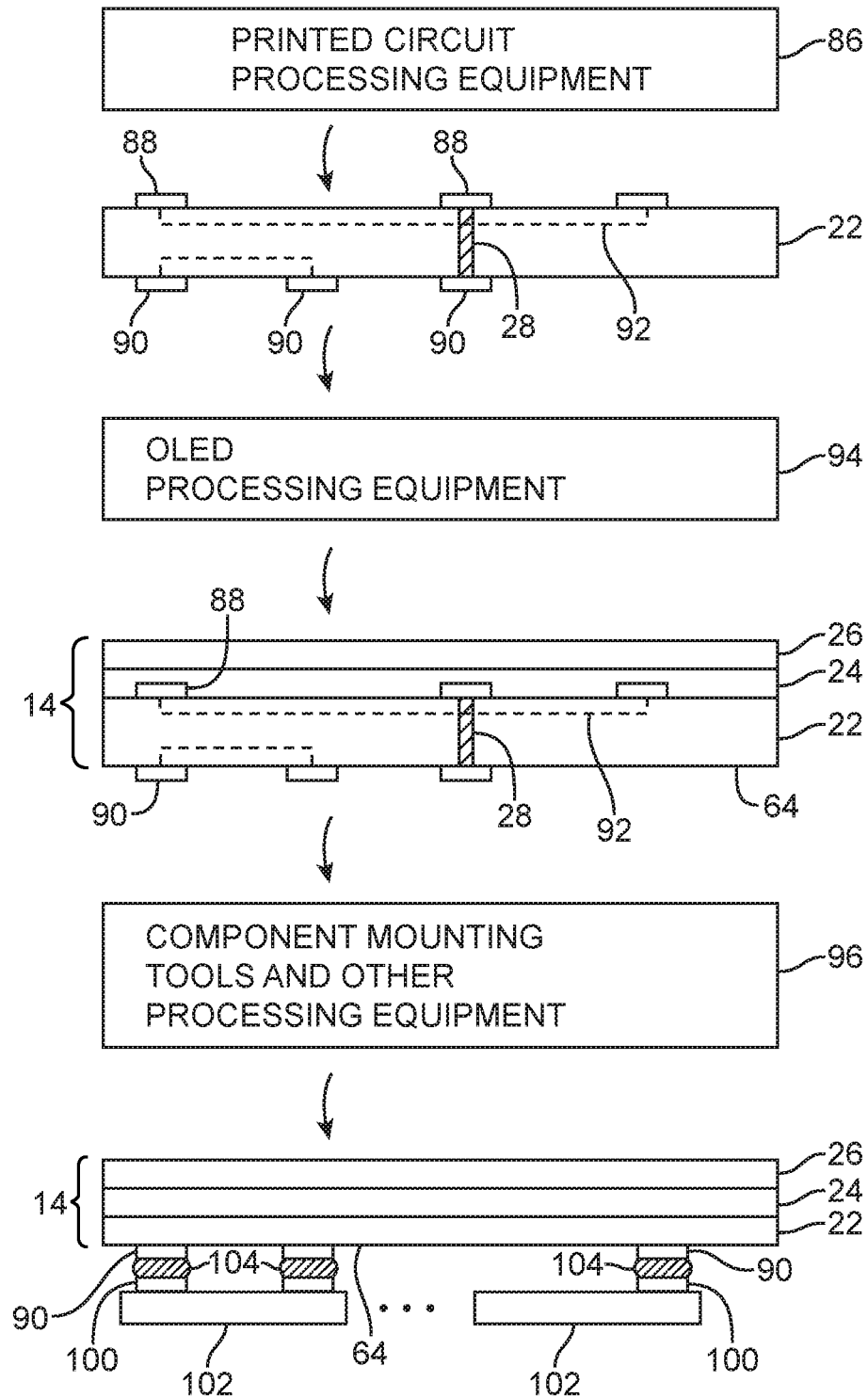
FIG. 6 is a diagram showing how a display may be formed from a substrate such as a flexible printed circuit substrate that has backside contacts in accordance with an embodiment of the present invention.

FIG. 6 is a diagram showing how display 14 may be formed from a two-sided printed circuit layer that serves as substrate 22.

Initially, printed circuit processing equipment 86 may be used to produce patterned two-sided printed circuit 22. Patterned two-sided printed circuit 22 may include patterned traces 88 and patterned traces 90 on opposing first (upper) and second (lower) surfaces. If desired, one or more layers of internal printed circuit traces such as traces 92 may be used to interconnect upper surface traces 88 and lower surface traces 90 (i.e., printed circuit layer 22 may include multiple sublayers of dielectric such as polyimide and one or more corresponding sublayers of patterned traces). Traces 92 may include vias 28.

Following formation of a multilayer printed circuit such as a two-sided printed circuit substrate or a multilayer printed circuit substrate that includes one or more patterned internal layers of traces and/or one or two exposed surfaces covered with of external traces such as substrate 22, OLED processing equipment 94 may be used to complete the formation of OLED display 14 by forming organic emissive material and light-emitting diode structures in layer 24 and covering layer 24 with sealant layer 26.

Component mounting tools and other processing equipment 96 may be used to mount components 102 to substrate 22. In particular, conductive material 104 such as solder, welds, conductive material associated with connector structures, anisotropic conductive film or other conductive adhesive, or other conductive material may be used to connect traces (contacts) 100 on components 102 to corresponding traces 90 on rear surface 64 of display 14. Examples of components 102 that equipment 96 may attach to traces 90 include integrated circuits, discrete components such as resistors, capacitors, and inductors, connectors, flex circuit cables and other printed circuit structures, and other circuitry. Components 102 may be, for example, surface mount technology (SMT) components and equipment 96 may be a pick-and-place tool.

The foregoing is merely illustrative of the principles of this invention and various modifications can be made by those skilled in the art without departing from the scope and spirit of the invention.

What is claimed is:

1. An electronic device comprising:
   a housing;
   an organic light-emitting diode display mounted in the housing, wherein the organic light-emitting diode display has an active area and an inactive area and comprises:
      a glass substrate;
      a thin-film transistor layer on the glass substrate;
      organic light-emitting diodes on the glass substrate in the active area;
      a sealant layer that overlaps the organic light-emitting diodes; and
      a conductive via that extends through the glass substrate in the inactive area and that is electrically connected to the thin-film transistor layer;
   a rigid printed circuit board having first and second opposing surfaces, wherein the via is electrically connected to a conductive structure on the first surface; and
   a display driver integrated circuit mounted to the second surface, wherein the via electrically connects the display driver integrated circuit to the thin-film transistor layer.

2. The electronic device defined in claim 1, wherein the conductive via has electroplated metal sidewalls.

3. The electronic device defined in claim 2, wherein the organic light-emitting diodes form an array of pixels that displays images to a user.

4. The electronic device defined in claim 3, wherein the inactive area is an inactive border region of the display that surrounds the array of pixels.

5. The electronic device defined in claim 4, further comprising:
   a plurality of additional conductive vias that extend through the glass substrate, wherein the plurality of additional conductive vias are formed in the inactive border region.

6. The electronic device defined in claim 5, further comprising:
   a transparent display cover layer over the display.

7. An electronic device, comprising:
   a housing;
   a display mounted in the housing, wherein the display comprises:
      a glass substrate;

an array of organic light-emitting diode pixels on the glass substrate that form an active region of the display;
an inactive region that surrounds the active region; and
a conductive via that extends through the glass substrate in the inactive region and that is electrically connected to the array of organic light-emitting diode pixels;
a printed circuit board electrically connected to the conductive via; and
a display driver integrated circuit mounted to the printed circuit board, wherein the printed circuit board is interposed between the display driver integrated circuit and the glass substrate.

8. The electronic device defined in claim 7, wherein the display comprises:
a layer of organic emissive material on the glass substrate that forms the array organic light-emitting diode pixels; and
a thin-film transistor layer on the glass substrate that is electrically connected to the array of organic light-emitting diode pixels.

9. The electronic device defined in claim 8, wherein the display driver integrated circuit provides signals to the thin-film transistor layer through the conductive via.

10. The electronic device defined in claim 9, wherein the display further comprises:
a sealant layer that overlaps the layer of organic emissive material and the thin-film transistor layer, wherein the layer of organic emissive material is between the glass substrate and the sealant layer.

11. The electronic device defined in claim 7, wherein the conductive via has electroplated metal sidewalls.

12. The electronic device defined in claim 11, further comprising:
a plurality of additional conductive vias that extend through the glass substrate in the inactive region and that are electrically connected to the array of organic light-emitting diode pixels.

13. The electronic device defined in claim 12, wherein each of the plurality of additional conductive vias has electroplated metal sidewalls.

14. The electronic device defined in claim 7, further comprising:
a transparent display cover layer that overlaps the display.

15. An electronic device, comprising:
a housing;
an organic light-emitting diode display mounted in the housing, wherein the organic light-emitting diode display comprises:
a glass substrate;
a thin-film transistor layer on the glass substrate;
organic light-emitting diodes on the glass substrate that form an array of pixels that displays images; and
a via in the glass substrate in an inactive edge region of the display that runs along the array of pixels, wherein the via has electroplated metal sidewalls that extend through the glass substrate;
a printed circuit board connected to the via; and
a display driver integrated circuit mounted to the printed circuit board, wherein the printed circuit board is interposed between the display driver integrated circuit and the glass substrate and provides signals to the array of pixels through the via.

16. The electronic device defined in claim 15, wherein the printed circuit board has first and second opposing surfaces, wherein the first surface is interposed between the second surface and the glass substrate, and wherein the display driver integrated circuit is mounted on the second surface.

17. The electronic device defined in claim 16, wherein the printed circuit board comprises a first conductive contact on the first surface that is electrically connected to a second conductive contact on the glass substrate.

18. The electronic device defined in claim 17, wherein the second conductive contact is electrically connected to the via.

19. The electronic device defined in claim 18, wherein the printed circuit board is a rigid printed circuit board.

20. The electronic device defined in claim 15 further comprising:
a plurality of additional vias in the glass substrate in the inactive edge region of the display, wherein each of the plurality of additional vias has electroplated metal sidewalls that extend through the glass substrate.

* * * * *